(12) United States Patent
Gao

(10) Patent No.: US 11,825,637 B2
(45) Date of Patent: Nov. 21, 2023

(54) SERVER RACK WITH TWO-PHASE LOOP RECIRCULATION

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 86 days.

(21) Appl. No.: 17/557,497

(22) Filed: Dec. 21, 2021

(65) Prior Publication Data

US 2023/0200027 A1   Jun. 22, 2023

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ..... *H05K 7/20818* (2013.01); *H05K 7/20327* (2013.01)

(58) Field of Classification Search
CPC .......... H05K 7/20818; H05K 7/20327; H05K 7/20809; H05K 7/2029; H05K 7/20336
See application file for complete search history.

(56) References Cited

U.S. PATENT DOCUMENTS

| | | | |
|---|---|---|---|
| 4,180,988 A * | 1/1980 | Forte ................. | F25B 13/00 62/474 |
| 10,201,116 B1 * | 2/2019 | Ross ................ | H05K 7/20836 |
| 2009/0100848 A1 * | 4/2009 | Kuriyama ............ | F28F 17/005 62/132 |
| 2013/0027883 A1 * | 1/2013 | Campbell .......... | H05K 7/20318 165/185 |
| 2013/0032310 A1 * | 2/2013 | Jaena .................. | H05K 7/1497 165/138 |
| 2013/0091867 A1 * | 4/2013 | Campbell .......... | H05K 7/20836 29/890.035 |
| 2014/0124167 A1 * | 5/2014 | Campbell .......... | H05K 7/20809 165/96 |
| 2015/0070846 A1 * | 3/2015 | Shelnutt ............. | H05K 7/20809 361/699 |
| 2016/0381838 A1 * | 12/2016 | Nakanishi ............... | F28D 15/06 361/679.53 |
| 2020/0084918 A1 * | 3/2020 | Shen .................. | H05K 7/20809 |
| 2020/0113084 A1 * | 4/2020 | He ........................... | G06F 1/20 |
| 2022/0361371 A1 * | 11/2022 | Unton ................ | H05K 7/20327 |

* cited by examiner

*Primary Examiner* — Anthony M Haughton
(74) *Attorney, Agent, or Firm* — WOMBLE BOND DICKINSON (US) LLP

(57) ABSTRACT

A rack with two-phase loop recirculation includes a supply manifold, a return manifold, and a separator. For example, a supply manifold is configured to receive two-phase cooling fluid from a cooling fluid source to distribute the two-phase cooling fluid to one or more server chassis. The two-phase cooling fluid is to extract heat from the one or more electronic devices and to transform into two-phase mixing fluid having at least a portion of the two-phase fluid transformed into vapor. A return manifold is configured to receive the two-phase mixing fluid from one or more loops associated with one or more electronic devices of the server chassis. A separator disposed on the return manifold is configured to separate the vapor of the two-phase mixing fluid and to divert first remaining two-phase cooling fluid of the two-phase mixing fluid directly back to the supply manifold through a return loop.

20 Claims, 7 Drawing Sheets

SERVER RACK WITH TWO-PHASE LOOP RECIRCULATION

FIELD OF THE INVENTION

Embodiments of the present invention generally relate to electronics cooling, cooling hardware, two phase liquid cooling, and rack cooling. More particularly, embodiments of the invention relate to a server rack with two-phase loop recirculation.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

Heat removal is a prominent factor in a computer system and data center design. The number of high performance electronics components such as high performance processors packaged inside servers have steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Previous solutions for the two-phase coolant do not consider the separation of vapor and liquid in the mixing phase in a loop. These solutions are not efficient for high power applications.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
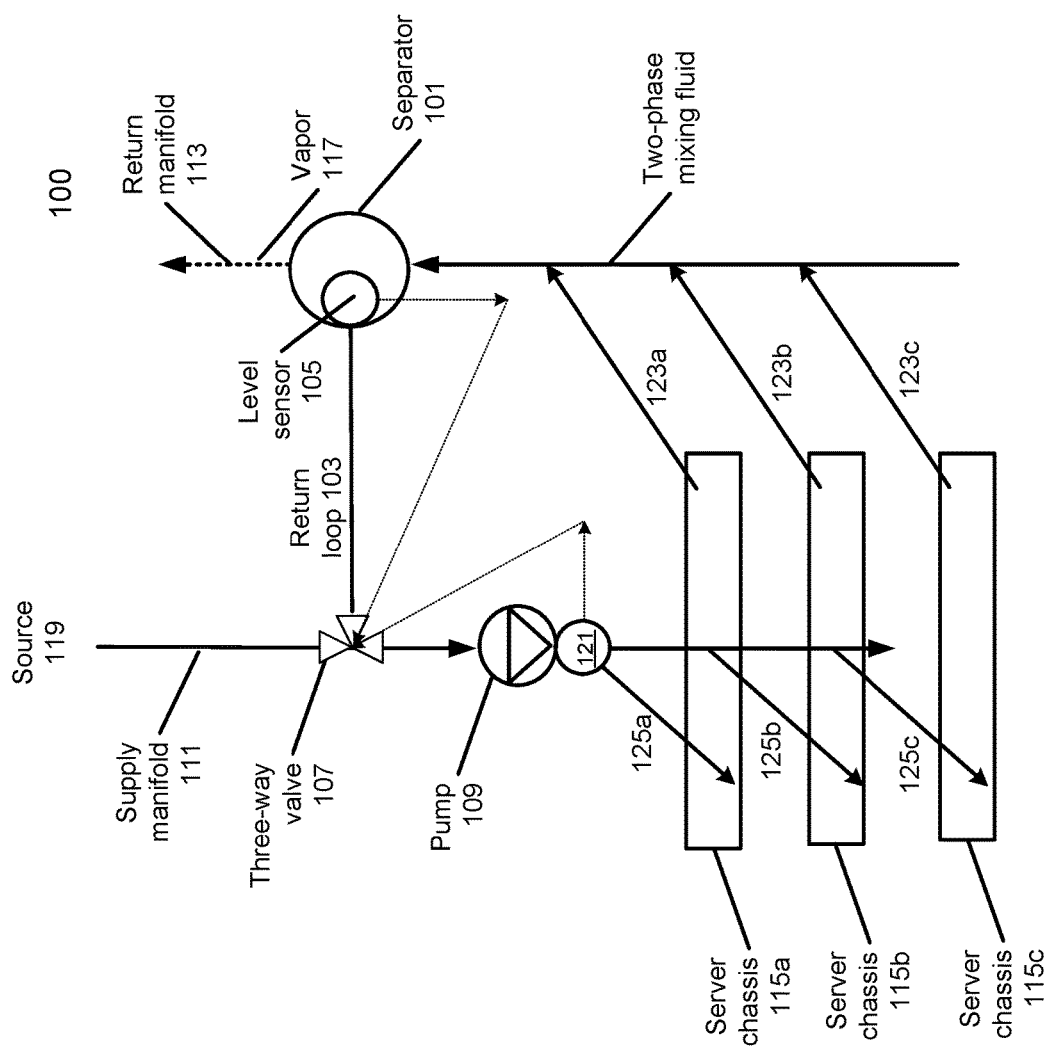
FIG. 1 shows an example design of a two-phase loop recirculation according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The present disclosure aims to propose an advanced server rack two-phase coolant management and recirculation design for high power density servers which are designed with two-phase cooling based thermal management solution, either directly or indirectly. In addition, the following features and functions are included in the present disclosure: high efficiency design with ease of implementation; significant increase server operation efficiency; improved IDC cooling efficiency; highly compatible design that can work with existing rack and server configurations; improving two phase coolant management; separation of vapor for better cooling efficiency; and feasible for different two phase based thermal management systems.

The present application relates to a server rack thermal recirculation design for running two-phase coolant. For example, the system design includes a separator that separates the two phase mixing fluid. In an embodiment, the separator enables vapor to be released from the loop (e.g., a return path), and liquid to be extracted directly back to the load (e.g., a supply path). Furthermore, the system includes valves to control the activation of the return liquid and is equipped with a supply side that has at least one pump that pushes fluid into individual servers. In addition, the fluid level sensor is used for regulating the valve and fluid mass flow rate is measured for controlling the overall coolant recirculation. It should be noted that all components of the server rack are fully integrated in the recirculation manifold with different embodiments to configure different systems.

According to one aspect, an electronic rack with two-phase loop recirculation includes a supply manifold, a return manifold, and a first separator according to an embodiment. For example, an electronic rack with two-phase loop recirculation includes a supply manifold is configured to receive two-phase cooling fluid from a cooling fluid source to distribute the two-phase cooling fluid to one or more server chassis according to an embodiment. Further, each of the server chassis contains one or more electronic devices, such as one or more servers. Furthermore, the two-phase cooling fluid is to extract heat from the one or more electronic devices and to transform into two-phase mixing fluid having at least a portion of the two-phase fluid evaporated into vapor.

In an embodiment, an electronic rack with two-phase loop recirculation includes a return manifold to receive the two-phase mixing fluid from one or more loops associated with the one or more electronic devices of the server chassis. In an embodiment, an electronic rack with two-phase loop recirculation includes a first separator disposed on the return manifold to separate the vapor of the two-phase mixing fluid and to divert first remaining two-phase cooling fluid of the two-phase mixing fluid back to the supply manifold through a first direct return loop.

In an embodiment, an electronic rack with two-phase loop recirculation includes a three-way valve disposed on the supply manifold and connected to the first separator to regulate a flow rate of the first remaining two-phase fluid of the two-phase mixing fluid back to the supply manifold. Further, the three-way valve is configured in a first position, the two-phase cooling fluid is allowed to flow to the server chassis from the cooling fluid source according to an embodiment. Furthermore, when the three-way valve is configured in a second position, the first remaining two-phase cooling fluid is circulated back to the server chassis via the supply manifold according to an embodiment.

In an embodiment, an electronic rack with two-phase loop recirculation includes a fluid level sensor disposed within the first separator to sense a fluid level within the first separator and to regulate the three-way valve and the flow rate of the first remaining two-phase cooling fluid of the two-phase mixing fluid back to the supply manifold based on the fluid level. Further, when the fluid level is above a predetermined fluid threshold, the three-way valve is configured to allow the first remaining two-phase cooling fluid to be circulated back to the supply manifold from the first separator according to an embodiment.

In an embodiment, an electronic rack with two-phase loop recirculation includes a pump coupled to the supply manifold to push the two-phase cooling fluid from the cooling fluid source and the first remaining two-phase cooling fluid of the two-phase mixing fluid from the first separator.

According to another aspect, an electronic rack with two-phase loop recirculation further includes a second separator disposed on the return manifold to separate the vapor from the two-phase mixing fluid returned from a second server chassis and to return second remaining cooling fluid back to the supply manifold via a second return loop, while the first separator is to separate the vapor from the two-phase mixing fluid returned from a first server chassis according to an embodiment. Further, the first server chassis is position above the second server chassis, and the first separator is further to receive at least the vapor generated by the second server chassis from the second separator according to an embodiment. Furthermore, the second separator is to return the second remaining two-phase cooling fluid to a segment of the supply manifold via the second return loop between the first server chassis and the second server chassis according to an embodiment.

According to another aspect, an electronic rack with two-phase loop recirculation further includes a third separator disposed on the return manifold to separate remaining cooling fluid from the two-phase mixing fluid and to return third remaining cooling fluid back to the supply manifold via a third return loop according to an embodiment. Further, the third return loop is connected between an inlet side of a main pump and the third separator according to an embodiment. Furthermore, the third separator is positioned at a bottom of the return manifold according to an embodiment.

According to another aspect, a data center cooling system includes a fluid supply line, a fluid return line, and a plurality of electronic racks coupled to the fluid supply line and the fluid return line according to an embodiment. For example, a data center cooling system includes a fluid supply line coupled to receive cooling fluid from a cooling fluid source according to an embodiment. Further, a data center cooling system includes a fluid return line coupled to return the cooling fluid to the cooling fluid source according to an embodiment. Furthermore, a data center cooling system includes a plurality of electronic racks coupled to the fluid supply line and the fluid return line according to an embodiment.

In an embodiment, each of the plurality of electronic racks includes a supply manifold, a return manifold, and a first separator according to an embodiment. For example, an electronic rack with two-phase loop recirculation includes a supply manifold is configured to receive two-phase cooling fluid from a cooling fluid source to distribute the two-phase cooling fluid to one or more server chassis according to an embodiment. Further, each of the server chassis contains one or more electronic devices, such as one or more servers. Furthermore, the two-phase cooling fluid is to extract heat from the one or more electronic devices and to transform into two-phase mixing fluid having at least a portion of the two-phase fluid transformed into vapor.

FIG. 1 shows example design 100 of a server rack with two-phase loop recirculation according to an embodiment of the application. In particular, FIG. 1 shows system design 100 including one separator 101 which is designed to dispose on return loop 103, which can be disposed at various locations. In an embodiment, separator 101 is used for separating a two-phase cooling fluid in its liquid phase from its vapor phase. In this example, with separator 101 is vertically assembled in the system, vapor 117 may escape and continue to arise through the vapor loop (e.g., return manifold 113), while at least a portion of cooling fluid in the liquid form is diverted via return loop or path 103 back to the supply side, i.e., supply manifold 111.

In an embodiment, design 100 of a server rack with two-phase loop recirculation includes separator 101 is connected with return loop 103 directly to return the liquid flow back to supply 111 (e.g., supply manifold). In the design shown in FIG. 1, three-way valve 107 is used for regulating the fluid. In addition, fluid flow on supply manifold 111 is powered by pump 109, and pump 109 is pumping the cooling fluid from source 119 and return flow (if valve 117 opens) according to an embodiment. Alternatively, mass flow rate data 121 is collected for controlling the valve 117 open ratio from source 119 according to an embodiment, which can be utilized by a controller (not shown) to further control valve 117 subsequently.

Further, fluid level sensor 105 is used within separator 101 and sensor 105 is used for regulating three-way valve 117 and the flow rate of the return flow back to supply 111 (e.g., supply manifold) according to an embodiment. For example, only the fluid level higher than the return loop port or higher than a predetermined threshold, return flow loop 103 is activated according to an embodiment. This is to ensure that minimum or no vapor will be directly back to supply 111 (e.g., supply manifold) according to an embodiment.

Furthermore, individual server loops are designed at lower locations of the separator (e.g., separator 101) according to an embodiment. In addition, the pump (e.g., pump 109) is used for pumping the fluid recirculating to the servers (e.g., 115a, 115b, 115c) according to an embodiment.

In an embodiment, electronic rack 100 with two-phase loop recirculation includes supply manifold 111, return manifold 113, and first separator 101 according to an embodiment. For example, electronic rack 100 with two-phase loop recirculation includes supply manifold 111 configured to receive two-phase cooling fluid from cooling fluid source 119 to distribute the two-phase cooling fluid to one or more server chassis (e.g., 115a, 115b, 115c) according to an embodiment. Further, each of the server chassis (e.g., 115a, 115b, 115c) configured to contain one or more electronic devices, such as one or more servers according to an embodiment. Furthermore, the two-phase cooling fluid is used to extract heat from the one or more electronic devices (e.g., 115a, 115b, 115c) and to transform into two-phase mixing fluid having at least a portion of the two-phase fluid transformed into vapor (e.g., 117) according to an embodiment.

In an embodiment, electronic rack 100 with two-phase loop recirculation includes return manifold 113 configured to receive the two-phase mixing fluid from one or more loops (e.g., 123a, 123b, 123c) associated with the one or more electronic devices of the server chassis (e.g., 115a, 115b, 115c).

In an embodiment, electronic rack 100 with two-phase loop recirculation includes first separator 101 disposed on return manifold 113 to separate vapor 117 of the two-phase mixing fluid and to divert first remaining two-phase cooling fluid of the two-phase mixing fluid back to supply manifold 111 through first return loop 103.

In an embodiment, electronic rack 100 with two-phase loop recirculation includes three-way valve 107 configured to dispose on supply manifold 111 and connect to first separator 101 to regulate a flow rate of the first remaining two-phase fluid of the two-phase mixing fluid back to supply manifold 111. Further, three-way valve 107 is configured in a first position, the two-phase cooling fluid is allowed to flow to the server chassis (e.g., 115a, 115b, 115c) from cooling fluid 119 source through one or more loops (e.g., 125a, 125b, 125c) according to an embodiment. Furthermore, when three-way valve 107 is configured in a second position, the first remaining two-phase cooling fluid is circulated back to the server chassis (e.g., 115a, 115b, 115c) via supply manifold 111 according to an embodiment.

In an embodiment, an electronic rack 100 with two-phase loop recirculation includes fluid level sensor 105 configured to dispose within first separator 101 to sense a fluid level within first separator 101 and to regulate three-way valve 107 and the flow rate of the first remaining two-phase cooling fluid of the two-phase mixing fluid back to supply manifold 111 based on the fluid level. Further, when the fluid level is above a predetermined fluid threshold, three-way valve 107 is configured to allow the first remaining two-phase cooling fluid to be circulated back to supply manifold 111 from first separator 101 according to an embodiment.

In an embodiment, electronic rack 100 with two-phase loop recirculation includes pump 109 coupled to the supply manifold 111 to push the two-phase cooling fluid from cooling fluid source 119 and the first remaining two-phase cooling fluid of the two-phase mixing fluid from first separator 101.

Figure 2:
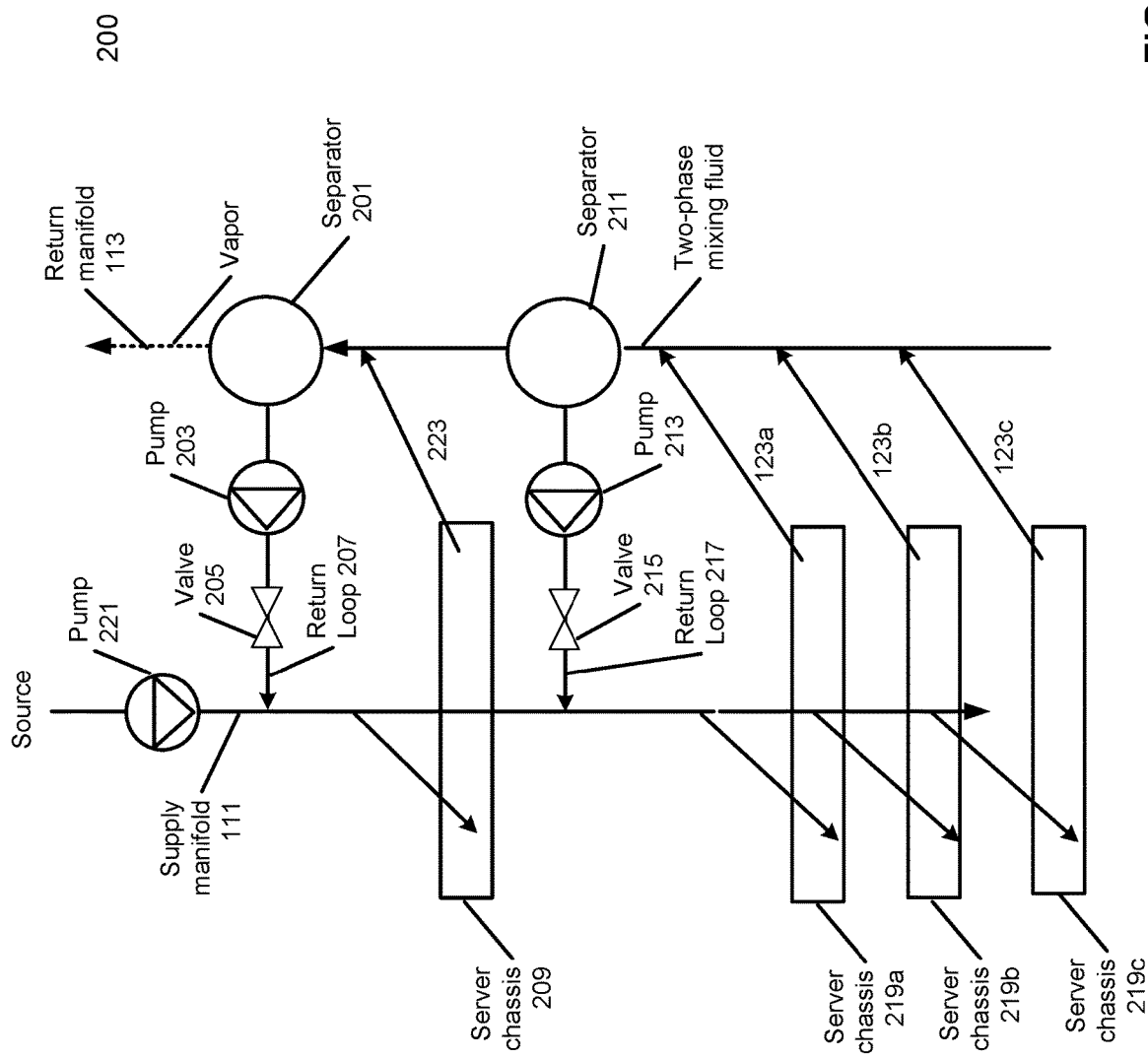
FIG. 2 shows another example design of a two-phase loop recirculation according to an embodiment of the application.

FIG. 2 shows another example design 200 of a server rack with two-phase loop recirculation according to an embodiment of the application. In particular, FIG. 2 shows another design 200 that more than one separators (e.g., 201, 211) are used in the system to enhance the function of separating the two-phase mixing stream according to an embodiment. It can be seen that each of the return flow loop (e.g., return loop 207, 217) is designed with control valve (e.g., 205, 215) and pump (e.g., 203, 213) according to an embodiment. The control valve and the pump may be controlled by a controller (e.g., a microcontroller, not shown). In addition, both these components are used for regulating the returning flow according to an embodiment.

Further, servers (e.g., 209, 219a, 219b, 219c) are being populated below (e.g., 219) or between (e.g., 209) the separators (e.g., 201, 211) according to an embodiment. In addition, the liquid flow may cumulate within the separators (e.g., 201, 211) according to an embodiment. In this design, each of the source loop 111 (e.g. supply manifold), and the two return flow loops (e.g., 207, 217) are assembled with the pumps (e.g., 203, 213) according to an embodiment. Alternatively, server chassis 209 can be understood as one or more servers according to an embodiment.

In an embodiment, electronic rack 200 with two-phase loop recirculation includes supply manifold 111, return manifold 113, first separator 201 and second separator 211 according to an embodiment. For example, electronic rack 200 with two-phase loop recirculation includes supply manifold 111 configured to receive two-phase cooling fluid from cooling fluid source to distribute the two-phase cooling fluid to one or more server chassis (e.g., 209, 219a, 219b, 219c) according to an embodiment. Further, each of the server chassis (e.g., 209, 219a, 219b, 219c) is configured to contain one or more electronic devices, such as one or more servers according to an embodiment. Furthermore, the two-phase cooling fluid is used to extract heat from the one or more electronic devices (e.g., 209, 219a, 219b, 219c) and to transform into two-phase mixing fluid having at least a portion of the two-phase fluid transformed into vapor according to an embodiment.

In an embodiment, electronic rack 200 with two-phase loop recirculation includes return manifold 113 configured to receive the two-phase mixing fluid from one or more loops (e.g., 223, 123a, 123b, 123c) associated with the one or more electronic devices of the server chassis (e.g., 209, 219a, 219b, 219c).

In an embodiment, electronic rack 200 with two-phase loop recirculation includes first separator 201 disposed on return manifold 113 to separate the vapor of the two-phase mixing fluid and to divert first remaining two-phase cooling fluid of the two-phase mixing fluid back to supply manifold 111 through first return loop 207. In an embodiment, electronic rack 200 with two-phase loop recirculation includes pump 221 coupled to supply manifold 111 to push the two-phase cooling fluid from cooling fluid source, the first remaining two-phase cooling fluid of the two-phase mixing fluid from first separator 201, and the second remaining two-phase cooling fluid of the two-phase mixing fluid from second separator 211.

In an embodiment, electronic rack 200 with two-phase loop recirculation further includes second separator 211 disposed on return manifold 113 to separate the vapor from the two-phase mixing fluid returned from second server chassis (e.g., 219a, 219b, 219c) and to return second remaining cooling fluid back to the supply manifold 111 via a second return loop 217, while first separator 201 is to separate the vapor from the two-phase mixing fluid returned from first server chassis 209 according to an embodiment. Further, first server chassis 209 is position above the second server chassis (e.g., 219a, 219b, 219c), and first separator 201 is further configured to receive at least the vapor generated by the second server chassis (e.g., 219a, 219b, 219c) from second separator 211 according to an embodiment. Furthermore, second separator 211 is to return the second remaining two-phase cooling fluid to a segment of the supply manifold via second return loop 217 between first server chassis 209 and second server chassis 219 according to an embodiment.

Figure 3:
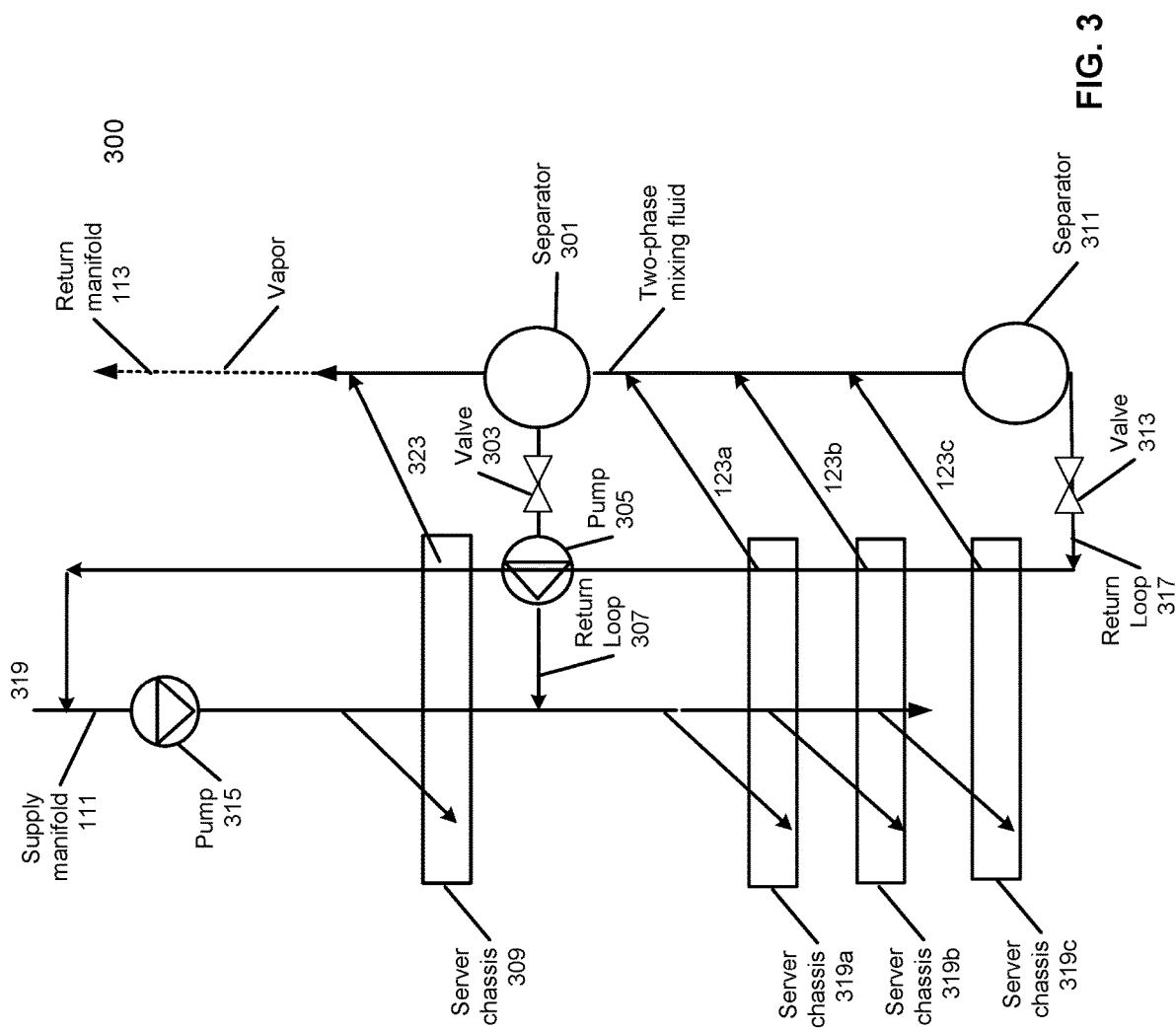
FIG. 3 shows an additional example design of a two-phase loop recirculation according to an embodiment of the application.

FIG. 3 shows example design 300 of a server rack with two-phase loop recirculation according to an embodiment of the application. In particular, FIG. 3 shows the design 300 that the server rack with two-phase loop recirculation system includes multiple separators (e.g., 301, 311) and one of the separators (e.g., 311) are designed at the bottom of the rack hardware according to an embodiment. This design 300 considers one of the best design for the separation of the liquid from the two-phase mixing stream, and the return loop (e.g., 307, 317) is directly connected to the inlet side of the main pump merging with the main source (e.g., 319) according to an embodiment.

Further, it can be seen that the above FIG. 1-FIG. 3 show the different system designs (e.g., 100, 200, 300) with different configurations of the return loops, pump and valve combinations, as well as the separator designs. In addition, the key mechanism is the same: to separate the two-phase coolant into a recirculation loop and to recirculate the liquid efficiently according to an embodiment.

In an embodiment, electronic rack 300 with two-phase loop recirculation includes supply manifold 111, return manifold 113, separator 301 and separator 311 according to an embodiment. For example, electronic rack 100 with two-phase loop recirculation includes supply manifold 111 configured to receive two-phase cooling fluid from cooling fluid source 119 to distribute the two-phase cooling fluid to one or more server chassis (e.g., 309, 319a, 319b, 319c) according to an embodiment. Further, each of the server chassis (e.g., 309, 319a, 319b, 319c) is configured to contain one or more electronic devices, such as one or more servers according to an embodiment. Furthermore, the two-phase cooling fluid is used to extract heat from the one or more electronic devices (e.g., 309, 319a, 319b, 319c) and to transform into two-phase mixing fluid having at least a portion of the two-phase fluid transformed into vapor according to an embodiment.

In an embodiment, electronic rack 300 with two-phase loop recirculation includes return manifold 113 configured to receive the two-phase mixing fluid from one or more loops (e.g., 323, 123a, 123b, 123c) associated with the one or more electronic devices of the server chassis (e.g., 309, 319a, 319b, 319c).

In an embodiment, electronic rack 300 with two-phase loop recirculation includes separator 301 disposed on return manifold 113 to separate vapor of the two-phase mixing fluid and to divert first remaining two-phase cooling fluid of the two-phase mixing fluid back to supply manifold 111 through first return loop 307.

In an embodiment, electronic rack 300 with two-phase loop recirculation includes pump 315 coupled to supply manifold 111 to push the two-phase cooling fluid from cooling fluid source, the first remaining two-phase cooling fluid of the two-phase mixing fluid from separator 301, and the second remaining two-phase cooling fluid of the two-phase mixing fluid from separator 311.

In an embodiment, electronic rack 300 with two-phase loop recirculation further includes separator 311 configured to dispose on the return manifold 113 to separate remaining cooling fluid from the two-phase mixing fluid and to return third remaining cooling fluid back to supply manifold 111 via third return loop 307 according to an embodiment. Further, third return loop 307 is configured to connect between an inlet side of main pump 315 and separator 311 according to an embodiment. Furthermore, separator 311 is positioned at a bottom of return manifold 113 according to an embodiment. Separator 311 may serve as a fluid collector to collect any cooling fluid that drops downwardly through return manifold 113 and returns the collected cooling fluid directly back to supply manifold 111 via return loop 117, while return manifold 113 allows the vapor arises upwardly to be eventually processed by a condenser.

Figure 4:
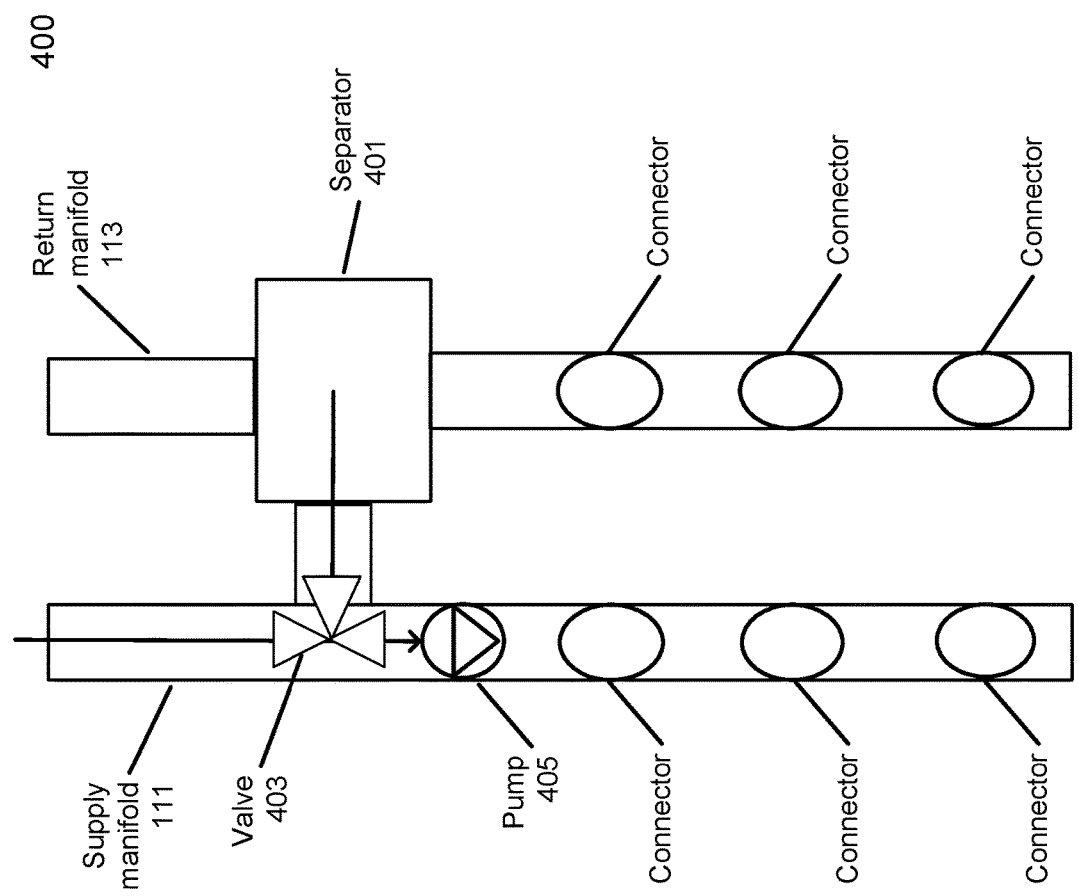
FIG. 4 shows an example of a server rack hardware according to an embodiment of the application.

FIG. 4 shows an example of a server rack hardware 400 according to an embodiment of the application. In particular, FIG. 4 shows that the server rack with two-phase loop recirculation systems are built fully on a rack hardware 400 such as a rack distribution manifold according to an embodiment. In addition, the manifold (e.g., 111, 113) includes the supply side 111 (e.g., supply manifold) and return side 113 (e.g., return manifold) according to an embodiment. For example, the separators (e.g., 401) are built on the return side 113 (e.g., return manifold) according to an embodiment. In this design 400, control valve 403 and the pumps (e.g., 405), as well as the sensors are all packaged on manifold 111 (e.g., supply manifold) according to an embodiment. In addition, the manifold 111 is vertically mounted to the rack, and systems (e.g., 100, 200, 300) shown in previous figures can be integrated to the manifold (e.g., 111) for different scenarios.

The connectors on the supply manifold 111 and the return manifold 113 can be used to connect with the corresponding server counterpart connectors for the purpose of distributing the cooling fluid to the server chassis and receive the cooling fluid returned from the server chassis. The connectors may be blind mate dripless connectors that automatically connect when a server chassis is pushed towards the supply manifold and return manifold.

Figure 5:
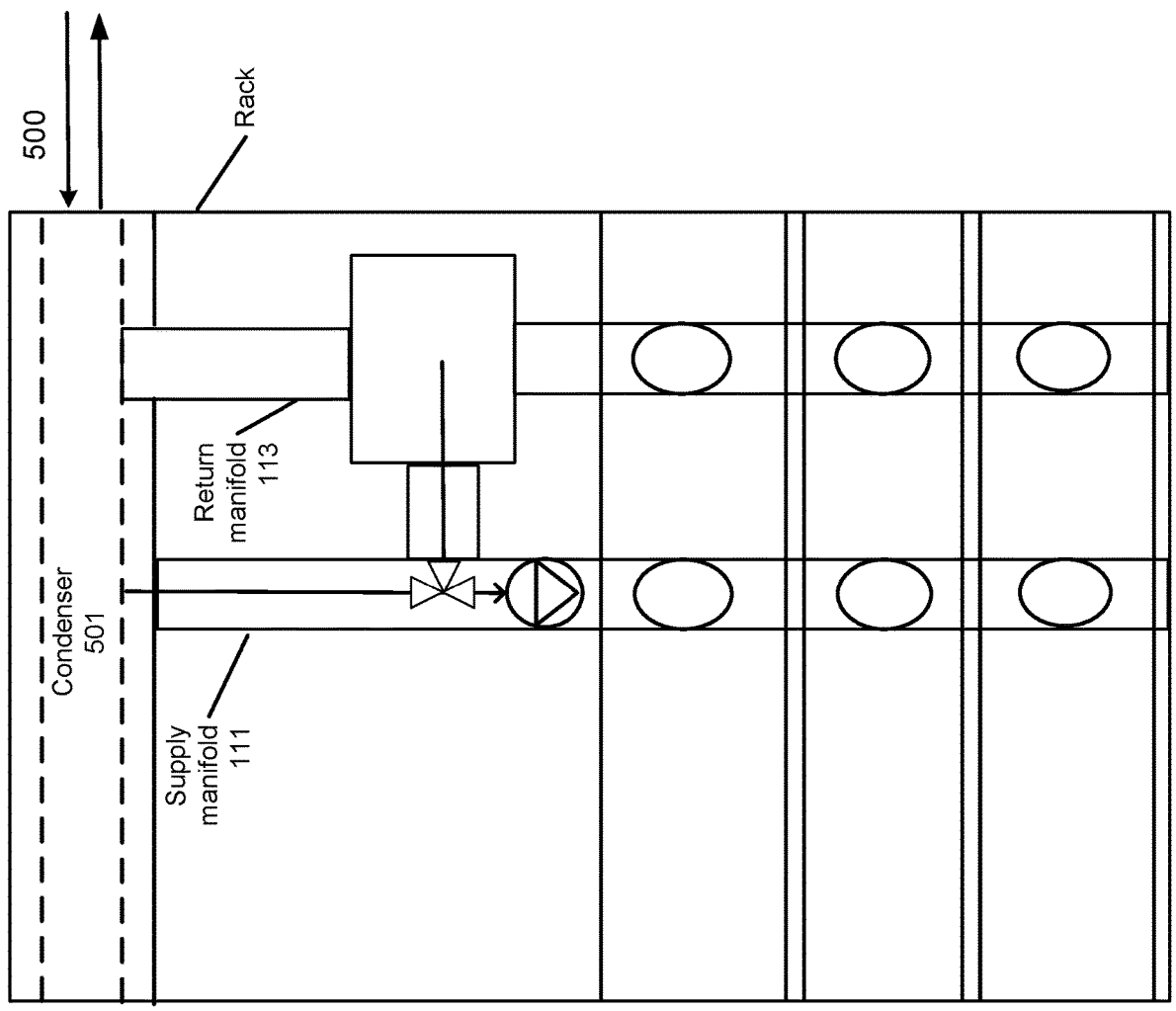
FIG. 5 shows an example implementation of a server rack with two-phase loop recirculation according to an embodiment of the application.

FIG. 5 shows an example implementation of a server rack 500 with two-phase loop recirculation according to an embodiment of the application. In particular, FIG. 5 shows a rack level integration design 500 including manifolds with the fluid separation and regulating hardware features built in according to an embodiment.

Further, the rack 500 may also include condenser unit 501 which is used for condensing the vapor and being connected to the supply of the manifold (e.g., supply manifold 111) according to an embodiment. In addition, condenser 501 and the rack manifold (e.g., 111, 113) may be directly connected to the system vapor line and liquid line according to an embodiment.

Figure 6:
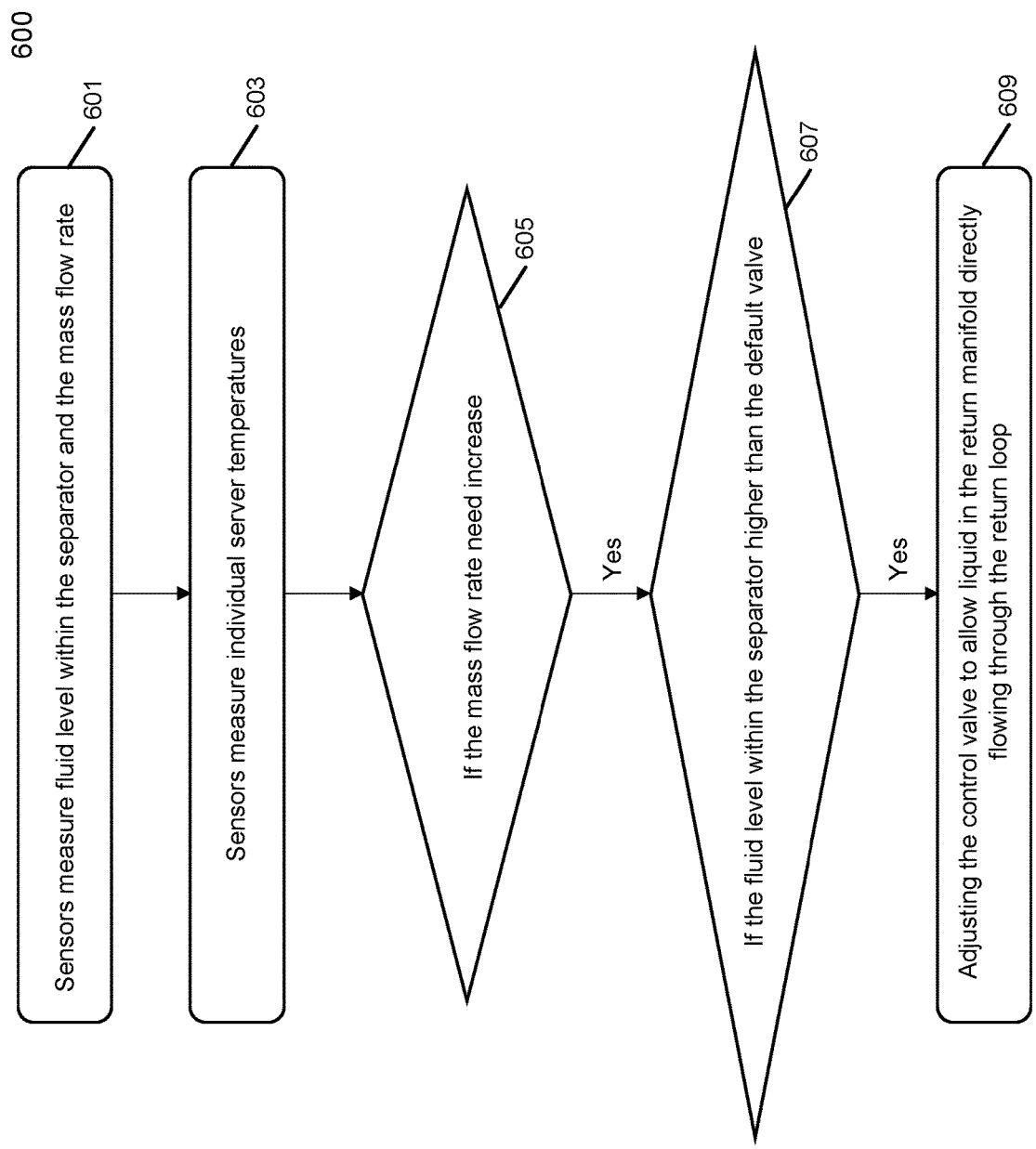
FIG. 6 shows an example of the system control flowchart of a server rack with two-phase loop recirculation according to an embodiment of the application.

FIG. 6 shows an example of a system control flowchart 600 of a server rack with two-phase loop recirculation according to an embodiment of the application. In particular, FIG. 6 shows the key control feature flowchart by using sensors according to an embodiment of the application. For example, the key of the disclosure is to control the return loop directly and to eliminate the vapor from the mixing fluid to divert first remaining two-phase cooling fluid of the two-phase mixing fluid back to the supply manifold directly through a first return loop according to an embodiment. In addition, all the features are integrated to the rack based unit according to an embodiment.

In an embodiment, at operation 601, sensors (e.g., 105) measure fluid level within the separator (e.g., 101, 201, 211, 301, 311), and sensors measure the mass flow rate (e.g., 121).

Further, at operation 603, sensors measure individual server (e.g., 115, 209, 219a, 219b, 219c, 309, 319a, 319b, 319c) temperatures according to an embodiment. Furthermore, at operation 605, if the mass flow rate (e.g., 121) need increase and then, at operation 607, if the fluid level within the separator (e.g., 101, 201, 211, 301, 311) higher than the default valve, then, at operation 609, the system will adjust the control valve (e.g., 107, 205, 215, 303, 313) to allow liquid in the return manifold (e.g., 113) directly flowing through the return loop (e.g., 103, 207, 217, 307, 317). It should be noted that system control flowchart 600 of a server rack with two-phase loop recirculation is used as an example to show one of the operation of the unit, and the key concept is to manage direct liquid fluid flowing back from return manifold 113 to supply manifold 111 with the fluid level (e.g., a predefined fluid level) within the separator measurements according to an embodiment.

Figure 7:
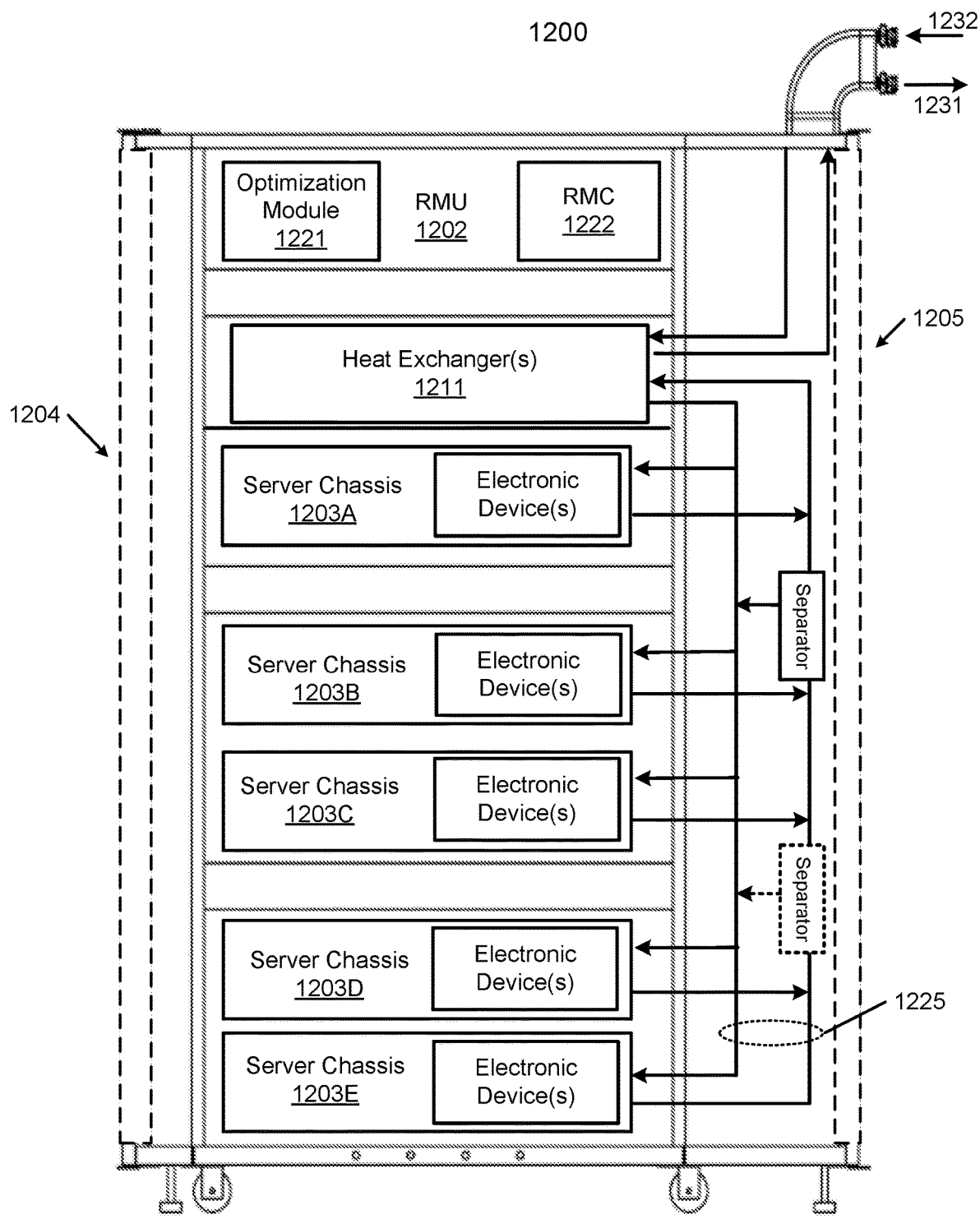
FIG. 7 is a block diagram illustrating an example of an electronic rack according to one embodiment

FIG. 7 is block diagram illustrating an electronic rack according to one embodiment. Electronic rack 1200 may represent any of the electronic racks as described throughout this application. According to one embodiment, electronic rack 1200 includes, but is not limited to, heat exchanger 1211, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Each server chassis may include one or more blade slots to receive one or more server blades. Each server blade represents one or more servers therein.

Note that although there are five server chassis 1203A-1203E shown here, more or fewer server chassis may be maintained within electronic rack 1200. Also note that the particular positions of heat exchanger 1211, RMU 1202, and/or server chassis 1203 are shown for the purpose of illustration only; other arrangements or configurations of heat exchanger 1211, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the backends of server chassis 1203 or on the electronic rack to generate airflows flowing from frontend 1204, traveling through the air space of the sever chassis 1203, and exiting at backend 1205 of electronic rack 1200.

In one embodiment, heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to rack manifold 1225 to form a secondary loop, which may include a supply manifold (also referred to as a rack liquid supply line or rack supply manifold) to supply cooling liquid to server chassis 1203 and a return manifold associated with one or more separators (also referred to as a rack liquid return line or rack return manifold) to return warmer liquid back to heat exchanger 1211. Note that heat exchanger 1211 can be any kind of heat exchangers commercially available or customized ones. Thus, the details of heat exchanger 1211 will not be described herein.

Each of server chassis 1203 may include one or more information technology (IT) components (e.g., electronic devices such as processors, memory, and/or storage devices). In one embodiment, in at least some of the server chassis 1203, an electronic device may be attached to a cold plate. The cold plate includes a liquid distribution channel to receive cooling liquid from the rack liquid supply line of rack manifold 1225. The cooling liquid performs heat exchange from the heat generated from the electronic device attached thereon. The cooling liquid carrying the exchanged heat is returned to the rack liquid return line of rack manifold 1225 and back to heat exchangers 1211.

In another embodiment, some of the server chassis 1203 may include an immersion tank containing immersion cooling liquid therein. The electronic devices of the corresponding server(s) are at least partially submerged into the immersion cooling liquid. The immersion cooling liquid may be dielectric cooling fluid, which may be circulated between the immersion tanks and heat exchanger 1211. The cooling liquid may be a single-phase cooling liquid or two-phase cooling liquid (also referred to as phase-change cooling liquid). The two-phase cooling liquid evaporates from a liquid form into a vapor form when the temperature of the cooling liquid is above a predetermined temperature threshold (e.g., the boiling point of the cooling liquid). The vapor flows upstream via the vapor line associated with one or more separators from the corresponding server chassis to heat exchanger 1211. Heat exchanger 1211 may include a condenser to condense the vapor from the vapor form back to the liquid form, where the cooling liquid is then supplied back to the server chassis.

Note that some of the server chassis 1203 may be configured with single-phase liquid cooling, while other server chassis may be configured with two-phase liquid cooling. Even within a single server chassis, some of the IT components may be configured with single-phase liquid cooling, while other IT components may be configured with two-phase liquid cooling. Rack manifold 1225 may include a first rack manifold for single-phase cooling and a second rack manifold for two-phase cooling to be coupled to the same or different server chassis for different types of cooling. Some of the sever chassis 1203 may be configured with regular liquid and air cooling, while other server chassis may be configured with immersion cooling.

Some of the IT components may perform data processing tasks, where the IT components may include software installed in a machine-readable medium such as a storage device, loaded into a memory, and executed by one or more processors to perform the data processing tasks. Server chassis 1203 may include a host server (referred to as a host node) coupled to one or more compute servers (also referred to as computing nodes). The host server (having one or more central processing units or CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more graphics/general processing units or GPUs) managed by the host server. The compute servers perform the actual tasks, which may generate heat during the operations.

Electronic rack 1200 further includes optional RMU 1202 configured to provide and manage power supplied to servers 1203 and heat exchanger 1211. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to at least some of the remaining components of electronic rack 1200.

In one embodiment, RMU 1202 includes optional optimization module 1221 and rack management controller (RMC) 1222. RMC 1222 may include a monitor to monitor operating status of various components within electronic rack 1200, such as, for example, computing nodes 1203, heat exchanger 1211, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by one or more fan modules and liquid pumps, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for a liquid pump, such that the total power consumption of the liquid pump and the fan modules reaches minimum, while the operating data associated with the liquid pump and cooling fans of the fan modules are within their respective designed specifications. Once the optimal pump speed and optimal fan speeds have been determined, RMC 1222 configures the liquid pump and cooling fans of the fan modules based on the optimal pump speeds and fan speeds.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
a supply manifold to receive two-phase cooling fluid from a cooling fluid source to distribute the two-phase cooling fluid to one or more server chassis, each of the server chassis containing one or more electronic devices, wherein the two-phase cooling fluid is to extract heat from the one or more electronic devices and to transform into two-phase mixing fluid having at least a portion of the two-phase fluid transformed into vapor;
a return manifold to receive the two-phase mixing fluid from one or more loops associated with the one or more electronic devices of the server chassis; and
a first separator disposed on the return manifold to separate the vapor of the two-phase mixing fluid and to divert first remaining two-phase cooling fluid of the two-phase mixing fluid back to the supply manifold through a first return loop.

2. The electronic rack of claim 1, further comprising:
a three-way valve disposed on the supply manifold and connected to the first separator to regulate a flow rate of the first remaining two-phase fluid of the two-phase mixing fluid back to the supply manifold.

3. The electronic rack of claim 2, wherein when the three-way valve is configured in a first position, the two-phase cooling fluid is allowed to flow to the server chassis from the cooling fluid source, and wherein when the three-way valve is configured in a second position, the first remaining two-phase cooling fluid is circulated back to the server chassis via the supply manifold.

4. The electronic rack of claim 2, further comprising:
a fluid level sensor disposed within the first separator to measure a fluid level within the first separator and to regulate the three-way valve and the flow rate of the first remaining two-phase cooling fluid of the two-phase mixing fluid back to the supply manifold based on the fluid level.

5. The electronic rack of claim 4, wherein when the fluid level is above a predetermined fluid threshold, the three-way valve is configured to manage the first remaining two-phase cooling fluid to be circulated back to the supply manifold from the first separator.

6. The electronic rack of claim 1, further comprising:
a pump coupled to the supply manifold to push the two-phase cooling fluid from the cooling fluid source and the first remaining two-phase cooling fluid of the two-phase mixing fluid from the first separator.

7. The electronic rack of claim 1, further comprising:
a second separator disposed on the return manifold to separate the vapor from the two-phase mixing fluid returned from a second server chassis and to return second remaining cooling fluid back to the supply manifold via a second return loop, while the first separator is to separate the vapor from the two-phase mixing fluid returned from a first server chassis.

8. The electronic rack of claim 7, wherein one or more server chassis with one or more server return loops are positioned between the first separator and the second separator, and wherein the second separator receives at least partial liquid from the first separator.

9. The electronic rack of claim 8, wherein the second separator is to return the second remaining two-phase cooling fluid to a segment of the supply manifold via the second return loop between the first server chassis and the second server chassis.

10. The electronic rack of claim 1, further comprising:
a third separator disposed on the return manifold to separate remaining cooling fluid from the two-phase mixing fluid and to return third remaining cooling fluid back to the supply manifold via a third return loop, wherein the third separator is positioned at a bottom of the return manifold.

11. The electronic rack of claim 10, wherein the third return loop is connected between an inlet side of a main pump and the third separator.

12. A data center cooling system, comprising:
a fluid supply line coupled to receive cooling fluid from a cooling fluid source;
a fluid return line coupled to return the cooling fluid to the cooling fluid source;
a plurality of electronic racks coupled to the fluid supply line and the fluid return line,
wherein each of the plurality of electronic racks comprises:
a supply manifold to receive two-phase cooling fluid from a cooling fluid source to distribute the two-phase cooling fluid to one or more server chassis, each of the server chassis containing one or more electronic devices, wherein the two-phase cooling fluid is to extract heat from the one or more electronic devices and to transform into two-phase mixing fluid having at least a portion of the two-phase fluid transformed into vapor;
a return manifold to receive the two-phase mixing fluid from one or more loops associated with the one or more electronic devices of the server chassis; and
a first separator disposed on the return manifold to separate the vapor of the two-phase mixing fluid and to divert first remaining two-phase cooling fluid of the two-phase mixing fluid back to the supply manifold through a first return loop.

13. The data center cooling system of claim 12, further comprising:
a three-way valve disposed on the supply manifold and connected to the first separator to regulate a flow rate of the first remaining two-phase fluid of the two-phase mixing fluid back to the supply manifold.

14. The data center cooling system of claim 13, wherein when the three-way valve is configured in a first position, the two-phase cooling fluid is allowed to flow to the server chassis from the cooling fluid source, and wherein when the three-way valve is configured in a second position, the first remaining two-phase cooling fluid is circulated back to the server chassis via the supply manifold.

15. The data center cooling system of claim 13, further comprising:
a fluid level sensor disposed within the first separator to measure a fluid level within the first separator and to regulate the three-way valve and the flow rate of the first remaining two-phase cooling fluid of the two-phase mixing fluid back to the supply manifold based on the fluid level.

16. The data center cooling system of claim 15, wherein when the fluid level is above a predetermined fluid threshold, the three-way valve is configured to manage the first remaining two-phase cooling fluid to be circulated back to the supply manifold from the first separator.

17. The data center cooling system of claim 12, further comprising:
a pump coupled to the supply manifold to push the two-phase cooling fluid from the cooling fluid source and the first remaining two-phase cooling fluid of the two-phase mixing fluid from the first separator.

18. The data center cooling system of claim 12, further comprising:
a second separator disposed on the return manifold to separate the vapor from the two-phase mixing fluid returned from a second server chassis and to return second remaining cooling fluid back to the supply manifold via a second return loop, while the first separator is to separate the vapor from the two-phase mixing fluid returned from a first server chassis, wherein one or more server chassis are positioned between the first separator and the second separator.

19. The data center cooling system of claim 12, further comprising:
a third separator disposed on the return manifold to separate remaining cooling fluid from the two-phase mixing fluid and to return third remaining cooling fluid back to the supply manifold via a third return loop, wherein the third separator is positioned at a bottom of the return manifold.

20. The data center cooling system of claim 19, wherein the third return loop is connected between an inlet side of a main pump and the third separator.

* * * * *